United States Patent [19]
Hida

[11] Patent Number: 6,023,079
[45] Date of Patent: Feb. 8, 2000

[54] COMPOUND SEMICONDUCTOR MEMORY WITH FLOATING GATE

[75] Inventor: Hikaru Hida, Tokyo, Japan

[73] Assignee: NEC Corporation, Tokyo, Japan

[21] Appl. No.: 08/677,347

[22] Filed: Jul. 2, 1996

[30] Foreign Application Priority Data

Jul. 7, 1995 [JP] Japan ................................. 7-196082

[51] Int. Cl.[7] ........................ H01L 29/812; H01L 29/788
[52] U.S. Cl. ........................................ 257/192; 257/316
[58] Field of Search ........................ 257/192, 194, 257/316, 321, 322

[56] References Cited

U.S. PATENT DOCUMENTS

| | | | |
|---|---|---|---|
| 4,295,150 | 10/1981 | Adam | 257/316 |
| 4,491,431 | 1/1985 | Aviram et al. | 400/241.1 |
| 4,905,063 | 2/1990 | Beltram et al. | 257/192 X |
| 5,147,817 | 9/1992 | Frazier et al. | 438/176 |
| 5,650,642 | 7/1997 | Sawada et al. | 257/192 |
| 5,773,325 | 6/1998 | Teramoto | 438/151 |

FOREIGN PATENT DOCUMENTS

| | | |
|---|---|---|
| 61-7666 | 1/1986 | Japan . |
| 2-35471 | 8/1990 | Japan . |
| 4-23474 | 1/1992 | Japan . |
| 5-198765 | 8/1993 | Japan . |
| 5-235367 | 9/1993 | Japan . |
| 5235367 | 9/1993 | Japan . |

OTHER PUBLICATIONS

J. A. Lott, et al., "Charge Storage in InAlAs/InGaAs/InP Floating Gate Heterostructures," Electronic Letters, Jul. 1990, vol. 26, No. 14, pp. 972–973.

*Primary Examiner*—John Guay
*Attorney, Agent, or Firm*—Sughrue, Mion, Zinn, Macpeak & Seas, PLLC

[57] ABSTRACT

A compound semiconductor memory has a second semiconductor layer (undoped AlGaAs hetero-barrier layer), a third semiconductor layer (n type InGaAs layer), a fourth semiconductor layer (undoped AlGaAs layer) and a gate electrode of WSi selectively deposited in order on an n type first semiconductor layer (n type GaAs channel layer). A drain electrode and a source electrode, which are electrically connected to the first semiconductor layer are formed on those areas of the first semiconductor layer where the second semiconductor layer or the like is not formed. At this time, the potential barrier of a floating gate (third semiconductor layer) on the gate electrode side is set higher than the potential barrier of the floating gate (first semiconductor layer) on the channel layer side.

15 Claims, 6 Drawing Sheets

COMPOUND SEMICONDUCTOR MEMORY WITH FLOATING GATE

BACKGROUND OF THE INVENTION

1. Field of the Invention

The present invention relates to a compound semiconductor memory, and, more particularly, to a fine non-volatile memory which is writable, readable and erasable.

2. Description of the Related Art

The mobility of a compound semiconductor like GaAs is greater by a factor of five to ten than Si at room temperature, so that the use of a compound semiconductor like GaAs for electronic devices can improve the operation speed. In this respect, the use of a compound semiconductor like GaAs has also been proposed in the field of non-volatile memories.

For instance, the memory structures which use two-dimensional electron gas stored at the interface between n-alGaAs layer and GaAs layer are disclosed in Examined Japanese Patent Publication No. Hei 57-162470 and Unexamined Japanese Patent Publication No. Sho 61-7666. These memory structures are hereinafter called "first prior art" and "second prior art," respectively.

Figure 1:
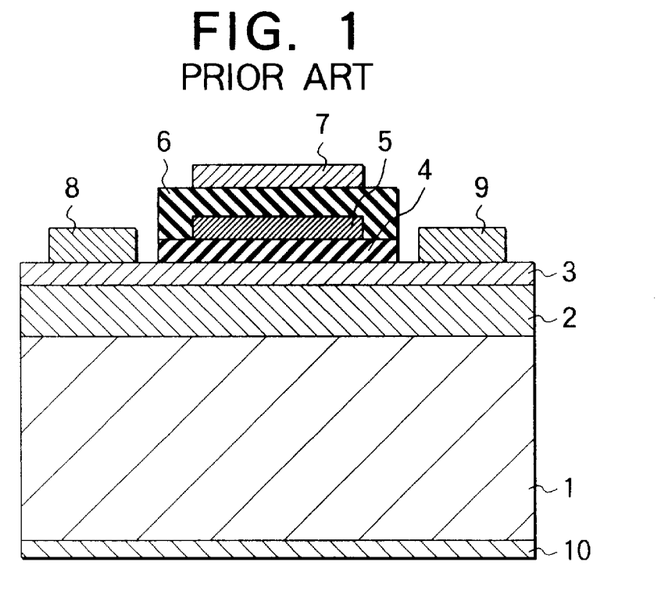
FIG. 1 is a cross-sectional view of a non-volatile memory according to the first prior art.

FIG. 1 presents a cross-sectional view of a non-volatile memory according to the first prior art. An n-alGaAs layer 2 is formed on an n-GaAS substrate 1, with an undoped GaAs thin film 3 formed on the n-AlGaAs layer 2. A first insulating film 4 is selectively formed of an oxide film on the undoped AlGaAs thin film 3, and a floating gate 5 of a high melting point metal or polycrystalline silicon or the like is formed on the first insulating film 4. A second insulating film 6 is so formed as to cover the floating gate 5.

A gate electrode 7 is formed on the second insulating film 6, and a source electrode 8 and a drain electrode 9 are selectively formed in the regions on the undoped GaAs thin film 3 where the first insulating film 4 is not formed. A substrate electrode 10 is formed at the back of this n-GaAs substrate 1.

Data can be written in or erased from the thus constituted non-volatile memory by storing positive or negative charges in the floating gate 5. In a read mode, an electron accumulated layer is formed at the interface between the n-AlGaAs layer 2 and the undoped GaAs thin film 3, so that the reading operation speed of the non-volatile memory can be increased by using this electron accumulated layer.

According to the first prior art, however, because the floating gate 5 of polycrystalline silicon or the like is formed on the undoped GaAs thin film 3 via the first insulating film 4 of $SiO_2$ or the like, the frequency dispersion of the capacitance-voltage (C-V) characteristic becomes greater due to, particularly, a large surface level present at the interface between the GaAs thin film 3 and the $SiO_2$ (first insulating film 4). This impairs the operational stability and reliability.

Figure 2:
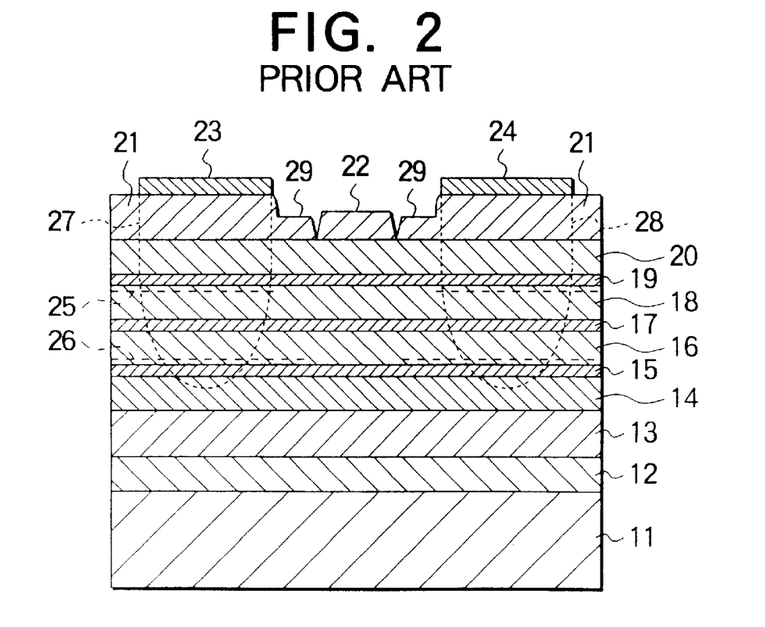
FIG. 2 is a cross-sectional view of a non-volatile semiconductor memory device according to the second prior art.

FIG. 2 presents a cross-sectional view of a non-volatile semiconductor memory device according to the second prior art. Epitaxially grown in order on a semiconductive GaAs substrate 11 are a first undoped GaAs layer 12, a first undoped AlGaAs layer 13, a first n type AlGaAs layer 14, a second undoped AlGaAs layer 15, a second undoped GaAs layer 16, a third undoped AlGaAs layer 17, a third undoped GaAs layer 18, a fourth undoped AlGaAs layer 19 and a second n type AlGaAs layer 20.

Formed on the n type AlGaAs layer 20 is an n type GaAs layer 21 in which a recess 29 is provided. The bottom of the recess 29 is selectively opened, thus exposing the second n type AlGaAs layer 20. A gate electrode 22 is formed on the exposed surface of the second n type AlGaAs layer 20. Further, a source electrode 23 and a drain electrode 24 are formed on the n type GaAs layer 21, apart from each other with the recess 29 in between. Respectively formed under those electrodes 23 and 24 are a source region 27 and a drain region 28 which are to be electrically connected to the second undoped GaAs layer 16.

According to the thus constituted non-volatile semiconductor memory device, a first two-dimensional electron gas layer 25 and a second two-dimensional electron gas layer 26, which store electrons in a write mode, are respectively formed in the third undoped GaAs layer 18 and in the second undoped GaAs layer 16. Because the third undoped AlGaAs layer 17, which has a smaller electron affinity than those of the third undoped GaAs layer 18 and the second undoped GaAs layer 16, is formed between those layers 18 and 16, however, the first two-dimensional electron gas layer 25 and the second two-dimensional electron gas layer 26 are electrically isolated completely from each other. The second prior art thus stably keeps the data written state without reducing the electrons stored in the two-dimensional electron gas layers 25 and 26.

According to the second prior art, however, the insulation between the third undoped GaAs layer 18 equivalent to a floating electrode and the source electrode 23 and drain electrode 24 is insufficient so that the time for retaining the electrons stored in the first two-dimensional electron gas layer 25 becomes shorter.

Unexamined Japanese Patent Publication No. Hei 4-23474 discloses a compound semiconductor device which has a floating electrode between the gate electrode and the drain electrode. This device will be called "third prior art."

Figure 3:
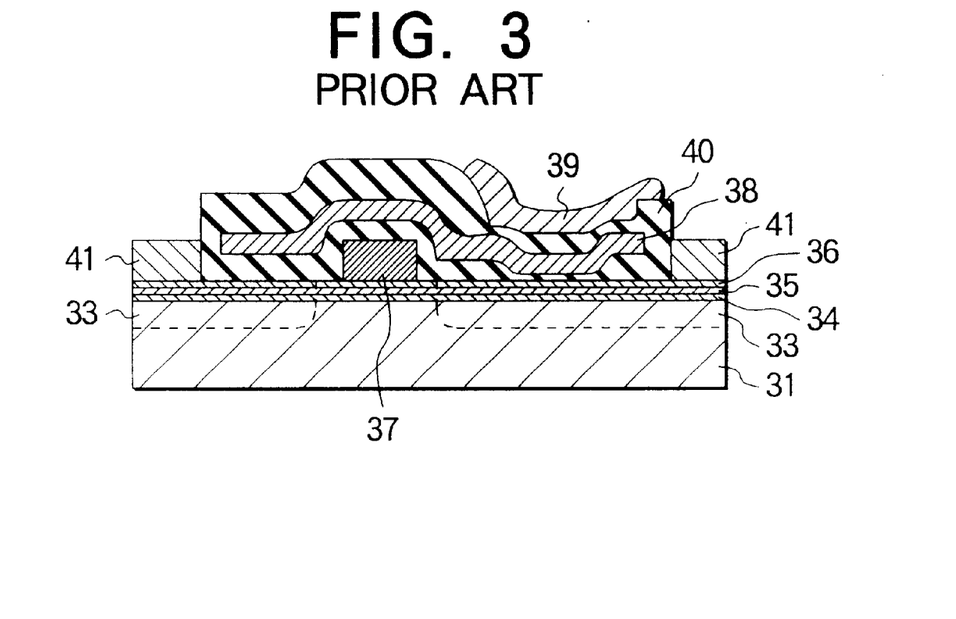
FIG. 3 is a cross-sectional view of a compound semiconductor device according to the third prior art.

FIG. 3 is a cross-sectional view of a compound semiconductor device according to the third prior art. An operation layer 34 of GaAs, an undoped AlGaAs layer 35 and an i-GaAs layer 36 are formed in order on a semiconductive GaAs substrate 31, and a control gate 37 is selectively formed on the surface of the resultant structure. A floating gate 38 surrounded by an insulating film 40 is so formed on the control gate 37 and i-GaAs layer 36 as to cover those layers 37 and 36. Further, a write electrode 39 is formed on the insulating film 40.

Further, two ohmic electrodes (source and drain electrodes) 41 are formed apart from each other on that region of the i-GaAs layer 36 where the insulating film 40 is not formed. A high concentration conductive layer 33 is formed in the substrate surface under those electrodes 41.

When electrons are not stored in the floating gate 38 in the thus constituted compound semiconductor device, a slight depletion layer is formed on the surface of the operation layer 34 by the surface level between the i-GaAs layer 36 and the insulating film 40. But, this depletion layer is not large enough to block the current which passes the channel. When electrons are injected into the floating gate 38, positive charges are induced on the surface of the operation layer 34, causing the depletion layer to fill up the channel region.

As the floating gate 38 is capable of changing the widths of the depletion layer between the gate and drain electrodes and between the source and gate electrodes to adjust the surface potential of the channel, the threshold voltage can be controlled. It is therefore possible to reduce the gate voltage, thus improving the breakdown voltage of the device.

Because the insulating film 40 of $SiO_2$ is formed on the i-GaAs layer 36, however, the third prior art like the first prior art suffers the reduction of the operational stability and reliability. The third prior art also suffers an increase in the device area, a decrease in integration density and a complicated manufacturing method.

Unexamined Japanese Patent Publication No. Hei 5-235367 discloses a non-volatile memory which is designed to prevent the reliability of the device characteristic from decreasing. This memory will be called "fourth prior art."

Figure 4:
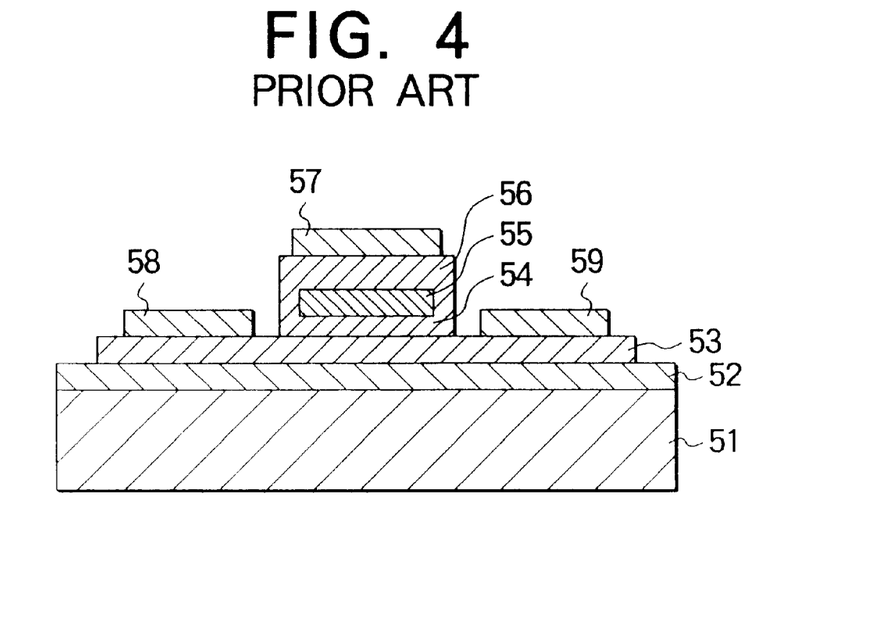
FIG. 4 is a cross-sectional view of a non-volatile memory according to the fourth prior art.

FIG. 4 is a cross-sectional view of a non-volatile memory according to the fourth prior art. An undoped GaAs layer 52 and an n-GaAs layer 53 are formed in order on a GaAs substrate 51. A first AlGaAs layer 54 having a large band gap is selectively formed on the n-GaAs layer 53 to be thick enough to pass the tunnel current, and an n$^+$-GaAs layer 55 having a small band gap is formed on the first AlGaAs layer 54. Formed on the n$^+$-GaAs layer 55 is a second AlGaAs layer 56 which covers this n$^+$-GaAs layer 55 and is thick enough not to pass the tunnel current. That is, the n$^+$-GaAs layer (floating electrode) 55 is surrounded by the AlGaAs layers 54 and 56 which have large band gaps.

A gate electrode 57 is formed on the second AlGaAs layer 55, and a drain electrode 58 and a source electrode 59 are selectively formed on the region of the n-GaAs layer 53 where the first AlGaAs layer 54 is not formed.

According to the thus constituted compound semiconductor memory, since the floating electrode is formed by a semiconductor layer (n$^+$-GaAs layer 55) of a high density impurity, it is possible to prevent the reliability of the device characteristic from decreasing by the surface level.

Because the peripheral portion of the floating electrode is all formed by semiconductor layers (AlGaAs layers 54 and 56) having the same band gaps, electrons to be stored in the floating electrode cannot be trapped sufficiently. In other words, the third and fourth prior arts have a difficulty to satisfy both the reduction of the voltages need to write and erase data and the improvement of the effect of trapping the stored electrons in the floating electrode.

As apparent from the above, no conventional memory structures have been developed yet which can satisfy the reduction of the device area, the reduction of the required voltages and the improvement of the operational stability and reliability.

SUMMARY OF THE INVENTION

Accordingly, it is an object of the present invention to provide a compound semiconductor memory which can reduce the device area and the voltages necessary for data writing and erasure, and improve the operational stability and reliability.

A compound semiconductor memory embodying this invention comprises:
a substrate;
a first semiconductor layer formed on the substrate, a channel being formed by the first semiconductor layer;
a second semiconductor layer deposited on the first semiconductor layer and having a smaller electron affinity than the first semiconductor layer;
a third semiconductor layer deposited on the second semiconductor layer and having a greater electron affinity than the second semiconductor layer;
a fourth semiconductor layer deposited on the third semiconductor layer and having a smaller electron affinity than the second semiconductor layer;
a gate electrode, formed on the fourth semiconductor layer, for controlling a conductivity of the channel;

a source electrode electrically connected to the channel; and
a drain electrode electrically connected to the channel, the gate electrode being located between the source electrode and the drain electrode.

This compound semiconductor memory may further comprise a buffer layer formed between the substrate and the first semiconductor layer.

The first semiconductor layer may be formed of GaAs, the second semiconductor layer may be formed of $Al_{0.25}Ga_{0.75}As$, the third semiconductor layer may be formed of $In_{0.25}Ga_{0.75}As$ and the fourth semiconductor layer may be formed of $Al_{0.5}Ga_{0.5}As$. It is preferable that this first semiconductor layer should be of an n type, and the second and fourth semiconductor layers should have impurity densities of approximately $1\times10^{10}$ to $1\times10^{17}$ cm$^{-3}$.

The second semiconductor layer may have an impurity density of approximately $1\times10^{17}$ to $1\times10^{20}$ cm$^{-3}$ and the fourth semiconductor layer may have an impurity density of approximately $1\times10^{10}$ to $1\times10^{17}$ cm$^{-3}$. It is now preferable that the first semiconductor layer have an impurity density of approximately $1\times10^{10}$ to $1\times10^{17}$ cm$^{-3}$.

This compound semiconductor memory may further comprise a p type fifth semiconductor layer formed between the substrate and the first semiconductor layer, and a first control gate electrically connected to the fifth semiconductor layer.

It is preferable that this compound semiconductor memory further comprise a sixth semiconductor layer formed between the third semiconductor layer and the fourth semiconductor layer, a seventh semiconductor layer formed between the sixth semiconductor layer and the fourth semiconductor layer, and means for changing a potential of the seventh semiconductor layer, and that the sixth semiconductor layer have a smaller electron affinity than the second semiconductor layer, and the seventh semiconductor layer have a greater electron affinity than those of the sixth semiconductor layer and the fourth semiconductor layer.

This compound semiconductor memory may further comprise n type eight semiconductor layers respectively formed between the source electrode and the first semiconductor layer and between the drain electrode and the first semiconductor layer.

A NAND type compound semiconductor memory according to another aspect of this invention comprises:
a substrate;
a p type fifth semiconductor layer formed on the substrate,
a first semiconductor layer formed on the fifth semiconductor layer, a channel being formed by the first semiconductor layer,
a plurality of devices formed on the first semiconductor layer and connected in series to one another,
a switch element, connected in series to the plurality of devices, for transferring an externally supplied potential to the devices, and
a first control electrode electrically connected to the fifth semiconductor layer.

Each device has a second semiconductor layer deposited on the first semiconductor layer and having a smaller electron affinity than the first semiconductor layer,
an n type third semiconductor layer deposited on the second semiconductor layer and having a greater electron affinity than the second semiconductor layer,
a fourth semiconductor layer deposited on the third semiconductor layer and having a smaller electron affinity than the second semiconductor layer,
a gate electrode, formed on the fourth semiconductor layer, for controlling a conductivity of the channel, a source electrode formed on the first semiconductor layer and electrically connected to the channel, and a drain electrode formed on the first semiconductor layer and electrically connected to the channel.

A NOR type compound semiconductor memory according to another aspect of this invention comprises:

a substrate;

a first semiconductor layer formed on a substrate, a channel being formed by the first semiconductor layer, a plurality of devices formed on the first semiconductor layer and connected in series to one another, and a switch element, connected in series to the plurality of devices, for transferring an externally supplied potential to the devices.

Each device has a second semiconductor layer deposited on the first semiconductor layer and having a smaller electron affinity than the first semiconductor layer, an n type third semiconductor layer deposited on the second semiconductor layer and having a greater electron affinity than the second semiconductor layer, a fourth semiconductor layer deposited on the third semiconductor layer and having a smaller electron affinity than the second semiconductor layer, a gate electrode, formed on the fourth semiconductor layer, for controlling a conductivity of the channel, a source electrode formed on the first semiconductor layer and electrically connected to the channel, and a drain electrode formed on the first semiconductor layer and electrically connected to the channel.

A plurality of series circuits, each comprised of the plurality of devices and the switch element connected in series, are arranged and connected in parallel to one another.

A compound semiconductor memory embodying this invention comprises:

a gate electrode for controlling a conductivity of a channel; and a floating gate formed between the gate electrode and the channel, the floating gate including a compound semiconductor layer having a high impurity density, a potential barrier of the floating gate on a side of the gate electrode being higher than a potential barrier of the floating gate on a side of the channel.

According to this invention, the floating gate made of a compound semiconductor having a high impurity density is formed between the gate electrode and the channel, and the potential barrier of this floating gate on the gate electrode side is set higher than the potential barrier on the channel side, so that the leak current is suppressed to thereby ensure the improvement on the operational stability and reliability. Because the semiconductor layers have a lamination structure, the device area can be reduced and they can continuously be formed by crystal growth, thus facilitating the manufacturing of the memory.

According to this invention, the floating gate is formed of Si and has a lower potential barrier than the one which is formed of an oxide film ($SiO_2$) that contacts the floating gate. Therefore, the memory can operate on a lower voltage and the writing time and erasing time can be shortened. Moreover, a modulation-doped structure can be used to improve the mobility of electrons in this invention, so that the reading time can be shortened too.

DETAILED DESCRIPTION OF THE PREFERRED EMBODIMENTS

Preferred embodiments of the present invention will now be described referring to the accompanying drawings.

Figure 5:
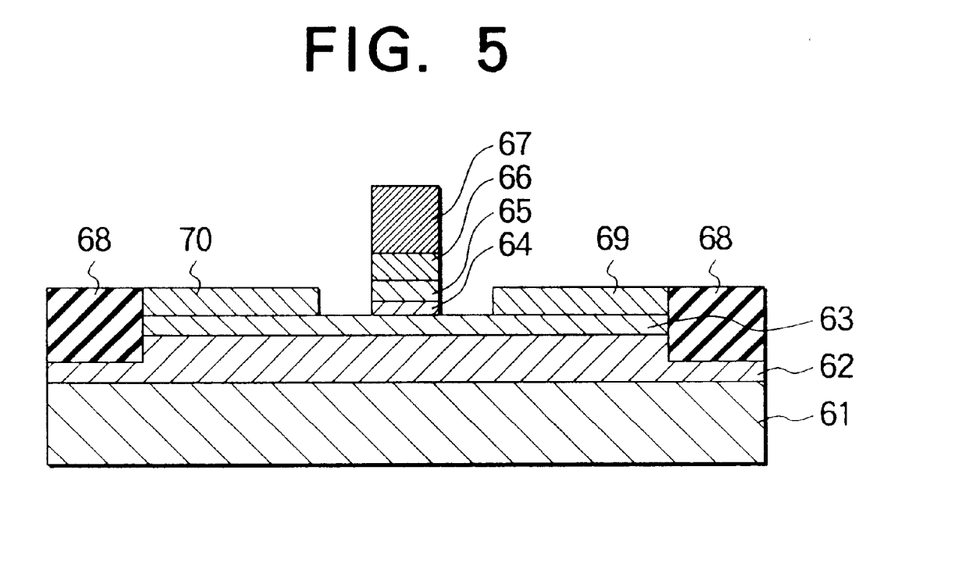
FIG. 5 is a cross-sectional view of a compound semiconductor memory according to the first embodiment of this invention.

FIG. 5 presents a cross-sectional view of a compound semiconductor memory according to the first embodiment of this invention. An undoped GaAs buffer layer 62 is formed on a semiconductive GaAS substrate 61 with a thickness of, for example, approximately 500 nm, and a first semiconductor layer (n type GaAs channel layer) 63 is formed on the buffer layer 62 with a thickness of, for example, approximately 50 nm. It is to be noted that this first semiconductor layer 63 have a donor density of, for example, approximately $5 \times 10^{17} cm^{-3}$.

A second semiconductor layer (undoped AlGaAs heterobarrier layer) 64, a third semiconductor layer (n type InGaAs layer) 65, a fourth semiconductor layer (undoped AlGaAs layer) 66 and a gate electrode 67 of WSi are selectively deposited in order on the first semiconductor layer 63. According to this embodiment, the second semiconductor layer 64 had a composition of $Al_{0.25}Ga_{0.75}As$ and a thickness of approximately 30 nm. The third semiconductor layer 65 had a composition of $In_{0.25}Ga_{0.75}As$, a donor density of $5 \times 10^{19}$ cm$^{-3}$ and a thickness of approximately 300 nm, and the fourth semiconductor layer 66 had a composition of $Al_{0.5}Ga_{0.5}As$ and a thickness of approximately 300 nm.

A drain electrode 69 and a source electrode 70 which are electrically connected to this first semiconductor layer (channel layer) 63 are formed on the regions of the first semiconductor layer 63 where the second semiconductor layer 64, etc. are not formed. Those electrodes 69 and 70 are ohmic electrodes formed of, for example, AuGe/Ni/Au. To isolate the device region where the gate electrode 67, the drain electrode 69 and the source electrode 70 from other regions, an insulation region 68 is so formed as to surround those electrodes. The insulation region 68 can be formed by ion injection using boron or oxygen or the like, or wet etching or dry etching.

Figure 6A:
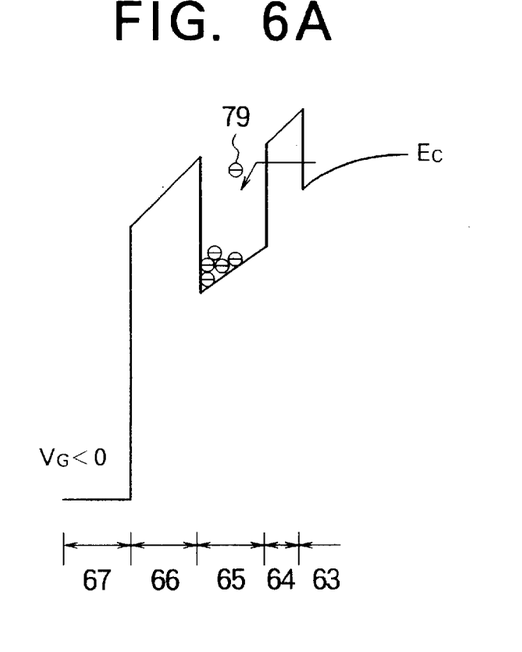
FIG. 6A is an exemplary diagram showing the potential distribution in a write mode for the compound semiconductor memory according to the first embodiment of this invention.
Figure 6B:
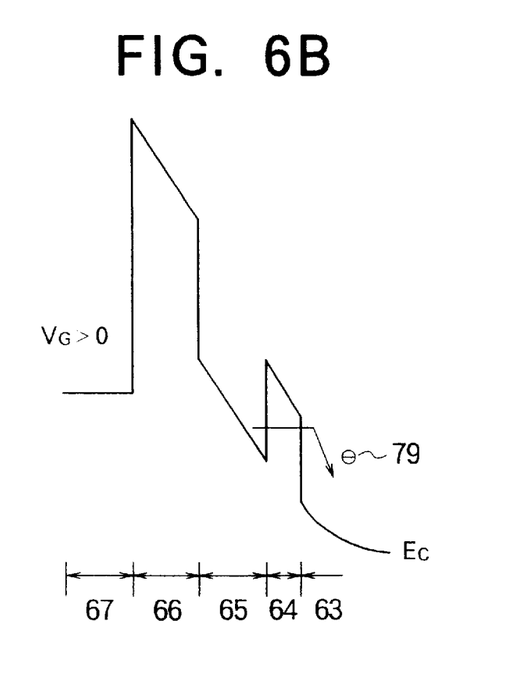
FIG. 6B is an exemplary diagram showing the potential distribution in a memory erase mode.

The operation principle of the compound semiconductor memory according to the first embodiment will now be described with reference to the potential distribution of a conduction band Ec directly below the gate electrode 67. FIG. 6A is an exemplary diagram showing the potential distribution in a write mode for the compound semiconductor memory according to the first embodiment of this invention, and FIG. 6B is an exemplary diagram showing the potential distribution in a memory erase mode. The numerals in the diagrams correspond to the regions indicated by the same reference numerals in FIG. 5.

First, in writing information into the memory using the injection of hot electrons, for example, 0 V is applied to the source electrode 70, 5 V to the drain electrode 69, and a voltage $V_G$ of 0.5 to 5 V to the gate electrode 67.

In this embodiment, the potential barrier against electrons 79 that are injected into the third semiconductor layer 65 with a high impurity concentration, which becomes the floating gate, from the first semiconductor layer (channel layer) 63 becomes about ⅒ of that of the SiMOSFET memory structure which uses $SiO_2$. Therefore, the voltage to be applied to the gate electrode 67 in a write mode can be reduced as compared with the prior arts. Because the memory structure of this embodiment basically uses a Schottky gate electrode, if an excess voltage is applied to the gate electrode 67, the device may be broken or the leak current may increase. It is thus necessary to optimize the applied voltage according to the device structure.

As shown in FIG. 6A, the difference between electron affinities of the third semiconductor layer 65 and the fourth semiconductor layer 66 is larger than the difference between electron affinities of the second semiconductor layer 64 and the third semiconductor layer 65. The efficiency of the injection of the electrons 79 is therefore excellent, so that the leak current to the gate electrode 67 can be decreased.

In erasing the memory, the tunnel current is used. For example, 5 V is applied to the source electrode 70, and the voltage $V_G$ of 0 V or higher is applied to the gate electrode 67. At this time, the drain electrode 69 may be set open, or like the source electrode 70, it may be applied with 5 V. Then, the tunnel effect causes the electrons 79 stored in the third semiconductor layer 65 to pass through the second semiconductor layer 64 and flow into the first semiconductor layer (channel layer) 65. As a result, the memory can be erased.

In the normal operation, a sense amplifier detects whether or not a transistor conducts to thereby determine if stored information is "1" or "0." In this manner, information can be read from the memory.

This embodiment is a device (memory cell structure) which has a hetero MIS (Metal-Insulator-Semiconductor) structure comprising the first semiconductor layer (n type GaAs channel layer) 63 and the second semiconductor layer (undoped AlGaAs hetero-barrier layer) 64. The compound semiconductor memory having such a structure can reduce the gate voltage and thus has an excellent breakdown voltage.

To improve the mobility of electrons traveling through the channel, a modulation-doped structure may be used. Specifically, a compound semiconductor memory with a modulation-doped structure can be prepared by using undoped GaAs or GaAs having a low-density impurity for the first semiconductor layer 63 instead of using n type GaAs, using $Al_{0.25}Ga_{0.75}As$ with a donor density of approximately $2\times10^{18}$ $cm^{-3}$ for the second semiconductor layer 64 instead of undoped AlGaAs, and leaving the other structure the same as that of the first embodiment. When undoped GaAs is used for the first semiconductor layer 63, this layer becomes an electron traveling layer and the $n^+$-AlGaAS layer as the second semiconductor layer becomes an electron supply layer, thus providing the memory structure which has a high electron mobility structure.

Various modifications are possible in this embodiment. For instance, a GaAs layer or the like may be formed as a surface stabilizing film between the gate electrode 67 and the fourth semiconductor layer 66. The drain electrode 69 and source electrode 70 may be formed on the second semiconductor layer 64 or on the third semiconductor layer 65. In this case, it is necessary to electrically isolate the gate electrode 67 from the drain electrode 69, and the gate electrode 67 from the source electrode 70 using an etching technology or the like.

Further, an impurity may be doped in both the first semiconductor layer 63 and the second semiconductor layer 64. This modification improves the breakdown voltage of the device and facilitates the optimization of the threshold voltage.

Figure 7:
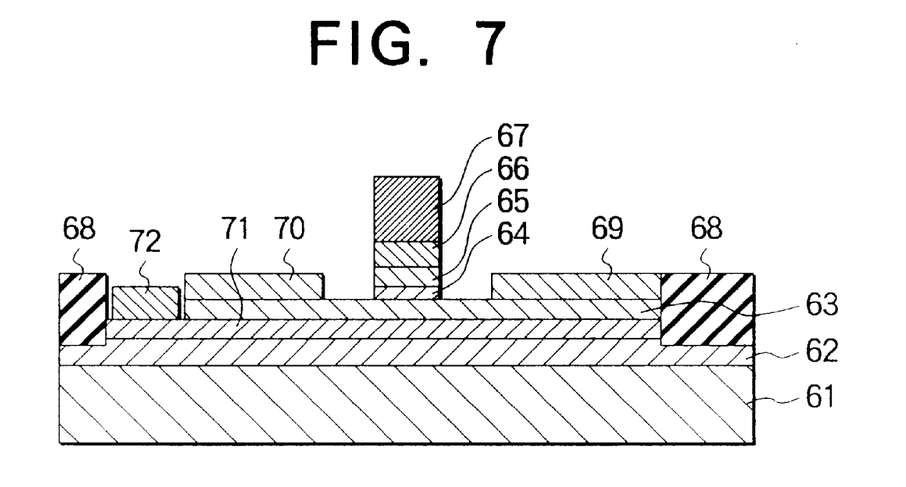
FIG. 7 is a cross-sectional view of a compound semiconductor memory according to the second embodiment of this invention.

FIG. 7 presents a cross-sectional view of a compound semiconductor memory according to the second embodiment of this invention. The second embodiment in FIG. 7 differs from the first embodiment in two points. First, a fifth semiconductor layer (p type GaAs layer) 71 is formed between the undoped GaAs buffer layer 62 and the first semiconductor layer (n type GaAs channel layer) 63. Secondly, a first control electrode 72 electrically connected to the fifth semiconductor layer 71 is formed in the device region. For the other portions, the second embodiment has the same structure as the first embodiment. To avoid the redundant description, therefore, same reference numerals are given in FIG. 7 to those components which are the same as the corresponding components of the first embodiment shown in FIG. 5.

According to this embodiment, the fifth semiconductor layer (p type GaAs layer) 71 had an acceptor density of $3\times10^{17}$ $cm^{-3}$ and a thickness of approximately 100 nm, for example. It is to be noted that the first control electrode 72 can be formed of, for example, WSi.

In the second embodiment, electrons stored in the floating gate (third semiconductor layer 65) can be drained by applying a positive voltage to the first control electrode 72. If an NAND type integrated memory is prepared by using the compound semiconductor memory according to this embodiment is used as a memory cell, collective erasure becomes possible which is advantageous. This case will be discussed later as the fourth embodiment.

Figure 8:
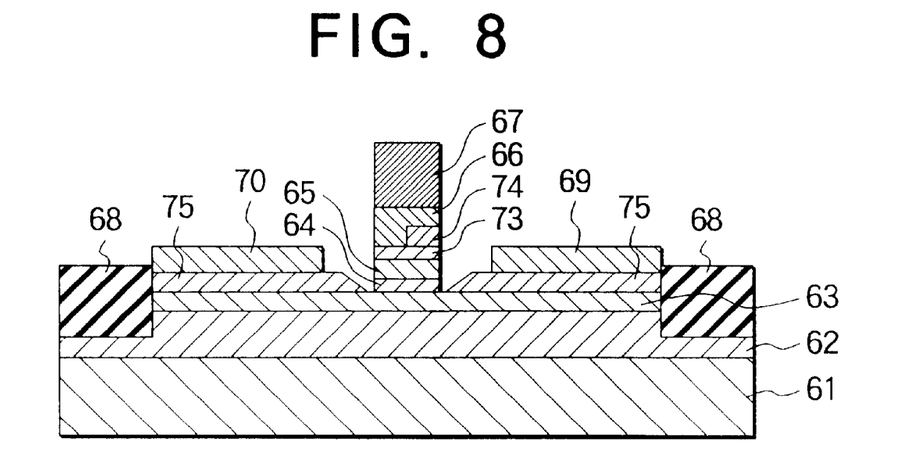
FIG. 8 is a cross-sectional view of a compound semiconductor memory according to the third embodiment of this invention.

FIG. 8 is a cross-sectional view showing a compound semiconductor memory according to the third embodiment of this invention. The third embodiment in FIG. 8 differs from the first embodiment in two points. First, an eighth semiconductor layers (n type GaAs layers) 75 are formed between the first semiconductor layer (n type GaAs channel layer) 63 and the drain electrode 69 and between the first semiconductor layer 63 and the source electrode 70. Those eighth semiconductor layers (n type GaAs layers) 75 can be formed by selective epitaxial growth using metal organic chemical vapor deposition (MOCVD) or metal organic molecular beam epitaxial (MOMBE), for example.

Secondly, a sixth semiconductor layer (undoped AlGaAs layer) 73 is formed between the third semiconductor layer (n type InGaAs layer) 65 and the fourth semiconductor layer (undoped AlGaAs layer) 66, and a seventh semiconductor layer (n type GaAs layer) 74 is selectively formed between the sixth semiconductor layer 73 and the fourth semiconductor layer 66. Connected to this seventh semiconductor layer 74 is some means which can change the potential of the seventh semiconductor layer 74, e.g., a second control electrode (not shown). For the other portions, the third embodiment has the same structure as the first embodiment, so that same reference numerals are given in FIG. 8 to those components which are the same as the corresponding components of the first embodiment shown in FIG. 5 to avoid the redundant description.

In this embodiment, the eight semiconductor layer 75 had its donor density set to about $5\times10^{18}$ cm$^{-3}$ and a thickness of about 50 nm. The sixth semiconductor layer 73 had a composition of $Al_{0.5}Ga_{0.5}As$ and a thickness of approximately 100 nm, and the seventh semiconductor layer 74 had a donor density of approximately $1\times10^{19}$ cm$^{-3}$ and a thickness of about 200 nm.

Because the eight semiconductor layers 75 are formed between the first semiconductor layer 63 and the drain electrode 69 and between the first semiconductor layer 63 and the source electrode 70 in the third embodiment, the parasitic resistance can be reduced. If a positive voltage is applied to the seventh semiconductor layer 74, electrons stored in the floating gate (third semiconductor layer 65) can easily be drained.

Although the fourth semiconductor layer 66 and the sixth semiconductor layer 73 in the third embodiment shown in FIG. 8 partially contact each other, the seventh semiconductor layer 74 may be formed on the entire region between those two layers.

Figure 9A:
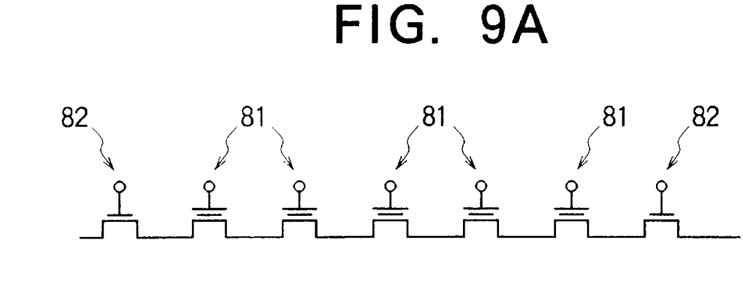
FIG. 9A is an exemplary diagram showing the interconnection layout of a compound semiconductor memory according to the fourth embodiment of this invention.
Figure 9B:
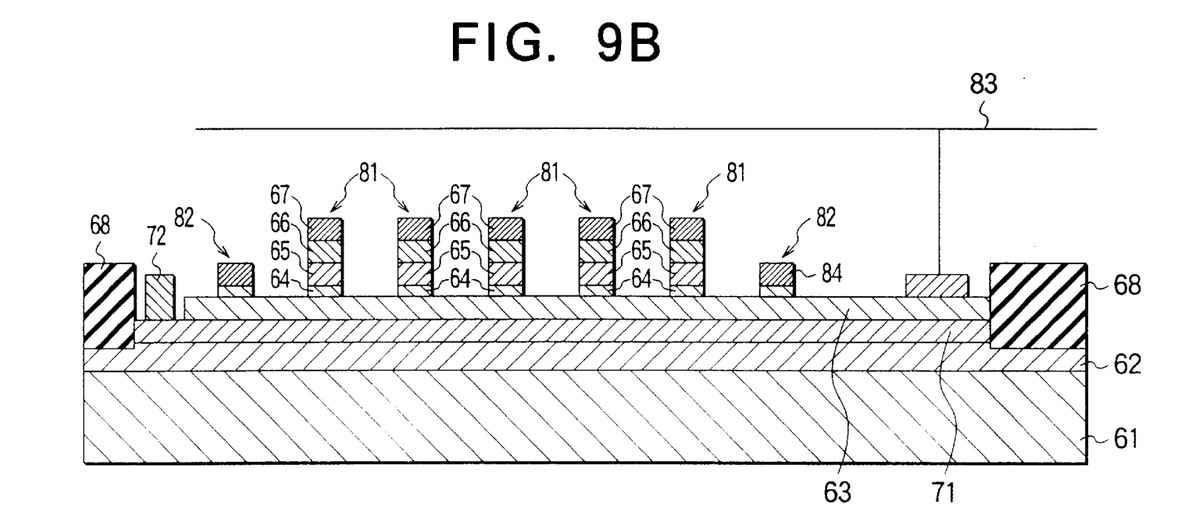
FIG. 9B is a cross-sectional view of the compound semiconductor memory according to this fourth embodiment.

FIG. 9A presents an exemplary diagram showing the interconnection layout of a compound semiconductor memory according to the fourth embodiment of this invention, and FIG. 9B is a cross-sectional view of the compound semiconductor memory according to this fourth embodiment. This compound semiconductor memory is a NAND type integrated memory which uses the compound semiconductor memory in FIG. 7 as a memory cell. Therefore, same reference numerals are given in FIG. 9 to those components which are the same as the corresponding components of the second embodiment shown in FIG. 7 to avoid the redundant description. The feature of a NAND type integrated memory lies in the collective erasure and collective writing to a plurality of memory cells connected to the same word line. In this embodiment, five non-volatile memory cells 81 are connected in series in a device region of the integrated memory, with selection switch elements 82 connected to both ends of the series circuit. Although the number of memory cells is five in this embodiment, the quantity can be set as desired.

According to the thus constituted integrated memory, electrons stored in the floating gates (third semiconductor layers 65) of the individual memory cells 81 are drained by setting the potentials of all the gate electrodes 67 to 0 V and applying a voltage of from 5 V to 20 V to the first control electrodes 72. This way, collective erasure of the memory is accomplished. At this time, a bit line 83 should be open.

In writing information into this integrated memory, an arbitrary word line (not shown) connected to the individual memory cells 81 is selected and a voltage of from 0.5 V to 5 V is applied to this selected word line and the gate electrodes 84 of the selection switch elements 82. The remaining unselected word lines are applied with, for example, 0.3 V and the bit line 83 is set to 0 V. Accordingly, information can be written collectively in the memory cells connected to the selected word line.

In a NOR type integrated memory, information can be written in the memory cells at random. For example, a NOR type integrated memory can be prepared by making the parallel connection of devices each having the memory structure of the first embodiment connected in series to the selection switch.

Although only four embodiments of the present invention have been described herein, it should be apparent to those skilled in the art that the present invention may be embodied in many other specific forms without departing from the spirit or scope of the invention. For instance, this invention may be adapted to all semiconductor materials, such as InP, In-alAs, GaSb, InSb, InAs, AlSb and GaInP.

What is claimed is:

1. A compound semiconductor memory comprising:
   a substrate;
   a first semiconductor layer formed on said substrate, a channel being formed by said first semiconductor layer;
   a second semiconductor layer deposited on said first semiconductor layer and having a smaller electron affinity than said first semiconductor layer;
   a third semiconductor layer deposited on said second semiconductor layer and having a greater electron affinity than said second semiconductor layer;
   a fourth semiconductor layer deposited on said third semiconductor layer and having a smaller electron affinity than said second semiconductor layer;
   a gate electrode, formed on said fourth semiconductor layer, for controlling a conductivity of said channel;
   a source electrode electrically connected to said channel; and
   a drain electrode electrically connected to said channel, said gate electrode being located between said source electrode and said drain electrode;
   wherein said first semiconductor layer is formed of GaAs, said second semiconductor layer is formed of $Al_{0.25}Ga_{0.75}As$, said third semiconductor layer is formed of $In_{0.25}Ga_{0.75}As$ and said fourth semiconductor layer is formed of $Al_{0.5}Ga_{0.5}As$.

2. The compound semiconductor memory according to claim 1, further comprising a buffer layer formed between said substrate and said first semiconductor layer.

3. The compound semiconductor memory according to claim 1, wherein said first semiconductor layer has an impurity density of approximately $1\times10^{10}$ to $1\times10^{17}$ cm$^{-3}$.

4. The compound semiconductor memory according to claim 1, further comprising a p type fifth semiconductor layer formed between said substrate and said first semiconductor layer, and a first control gate electrically connected to said fifth semiconductor layer.

5. The compound semiconductor memory according to claim 4, further comprising n type sixth and seventh semiconductor layers respectively formed between said source electrode and said first semiconductor layer, and between said drain electrode and said first semiconductor layer.

6. The compound semiconductor memory according to claim 1, further comprising:
   a fifth semiconductor layer formed between said third semiconductor layer and said fourth semiconductor layer and having a smaller electron affinity than that of said second semiconductor layer;
   a sixth semiconductor layer formed between said fifth semiconductor layer and said fourth semiconductor layer and having a greater electron affinity than those of said fifth semiconductor layer and said fourth semiconductor layer; and
   a changing mechanism which changes a potential of said sixth semiconductor layer.

7. A compound semiconductor memory comprising:

a substrate;

a first semiconductor layer formed on said substrate, a channel being formed by said first semiconductor layer;

a second semiconductor layer deposited on said first semiconductor layer and having a smaller electron affinity than said first semiconductor layer, said second semiconductor layer having an electron affinity that is substantially constant in a thickness direction of said second semiconductor layer;

a third semiconductor layer deposited on said second semiconductor layer and having a greater electron affinity than said second semiconductor layer;

a fourth semiconductor layer deposited on said third semiconductor layer and having a smaller electron affinity than said second semiconductor layer;

a gate electrode, formed on said fourth semiconductor layer, for controlling a conductivity of said channel;

a source electrode electrically connected to said channel; and a drain electrode electrically connected to said channel, said gate electrode being located between said source electrode and said drain electrode;

wherein said first semiconductor layer is of an n type, and said second and fourth semiconductor layers have impurity densities of approximately $1 \times 10^{10}$ to $1 \times 10^{17}$ cm$^{-3}$.

8. The compound semiconductor memory according to claim 7, wherein said first semiconductor layer has an impurity density of approximately $1 \times 10^{10}$ to $1 \times 10^{17}$ cm$^{-3}$.

9. The compound semiconductor memory according to claim 7, further comprising a buffer layer formed between said substrate and said first semiconductor layer.

10. A compound semiconductor memory comprising:

a substrate;

a first semiconductor layer formed on said substrate, a channel being formed by said first semiconductor layer;

a second semiconductor layer deposited on said first semiconductor layer and having a smaller electron affinity than said first semiconductor layer;

a third semiconductor layer deposited on said second semiconductor layer and having a greater electron affinity than said second semiconductor layer;

a fourth semiconductor layer deposited on said third semiconductor layer and having a smaller electron affinity than said second semiconductor layer;

a gate electrode, formed on said fourth semiconductor layer, for controlling a conductivity of said channel;

a source electrode electrically connected to said channel; and a drain electrode electrically connected to said channel, said gate electrode being located between said source electrode and said drain electrode;

wherein said second semiconductor layer has an impurity density of approximately $1 \times 10^{17}$ to $1 \times 10^{20}$ cm$^{-3}$, and said fourth semiconductor layer has an impurity density of approximately $1 \times 10^{10}$ to $1 \times 10^{17}$ cm$^{-3}$.

11. The compound semiconductor memory according to claim 10, further comprising a buffer layer formed between said substrate and said first semiconductor layer.

12. The compound semiconductor memory according to claim 10, wherein said first semiconductor layer has an impurity density of approximately $1 \times 10^{10}$ to $1 \times 10^{17}$ cm$^{-3}$.

13. A compound semiconductor memory comprising:

a gate electrode for controlling a conductivity of a channel; and a floating gate formed between said gate electrode and said channel, said floating gate including a compound semiconductor layer having a high impurity density, a difference between electron affinities of said compound semiconductor layer and a first layer adjacent to said floating gate being higher than a difference between electron affinities of said compound semiconductor layer and a second layer adjacent to said floating gate, wherein said first layer is adjacent to said compound semiconductor layer and is disposed between said compound semiconductor layer and said gate electrode, and wherein said second layer is disposed adjacent to said compound semiconductor layer and is disposed between said compound semiconductor layer and said channel wherein an electron affinity of said second layer is substantially constant in a layer thickness direction of the second layer.

14. The compound semiconductor memory of claim 13, wherein said first layer adjacent to the compound semiconductor layer has an impurity concentration of $1 \times 10^{17}$ to $1 \times 10^{20}$ cm$^{-3}$ and the second layer adjacent to the compound semiconductor layer has an impurity concentration of $1 \times 10^{10}$ to $1 \times 10^{17}$ cm$^{-3}$.

15. A compound semiconductor memory comprising:

a gate electrode for controlling a conductivity of a channel; and a floating gate formed between said gate electrode and said channel, wherein said floating gate includes a compound semiconductor layer having a high impurity density, and wherein said floating gate is formed so that it has a higher potential barrier on a side nearest to said gate electrode than on a side nearest to said channel.

* * * * *